United States Patent

Linliu

[11] Patent Number: 6,100,577
[45] Date of Patent: Aug. 8, 2000

[54] CONTACT PROCESS USING Y-CONTACT ETCHING

[75] Inventor: Kung Linliu, Taipei, Taiwan

[73] Assignee: Vanguard International Semiconductor Corporation, Hsin-Chu, Taiwan

[21] Appl. No.: 09/377,542

[22] Filed: Aug. 19, 1999

Related U.S. Application Data

[62] Division of application No. 08/835,575, Apr. 9, 1997, Pat. No. 5,950,104.

[51] Int. Cl.[7] .................................................. H01L 39/00
[52] U.S. Cl. .............................................. 257/622; 257/626
[58] Field of Search .................................. 257/774, 622, 257/624, 626, 632

[56] References Cited

U.S. PATENT DOCUMENTS

| | | |
|---|---|---|
| 5,091,768 | 2/1992 | Yamazaki . |
| 5,420,078 | 5/1995 | Sikora ........................................ 437/228 |
| 5,441,595 | 8/1995 | Yamagata et al. .................... 156/643.1 |
| 5,490,901 | 2/1996 | Kim ........................................ 156/643.1 |
| 5,552,343 | 9/1996 | Hsu ........................................ 437/195 |
| 5,684,331 | 11/1997 | Jun . |
| 5,852,328 | 12/1998 | Nishimura et al. . |
| 5,883,436 | 3/1999 | Sadjadi et al. . |

*Primary Examiner*—Sheila V. Clark
*Attorney, Agent, or Firm*—George O. Saile; Stephen B. Ackerman

[57] ABSTRACT

A method is disclosed for forming Y-shaped holes in semiconductor substrates by using Y-contact etching. The hole is formed with a single, two-step dry-etching process in a single chamber with one masking step for the whole hole. The upper portion of the Y-shaped hole is formed by means of an isotropic tapered dry-etching process while the lower portion is formed by means of a straight anisotropic recipe of the same dry-etching process. The result is a Y-shaped hole formed with fewer process steps and with maximized contact area for improved reliability.

4 Claims, 5 Drawing Sheets

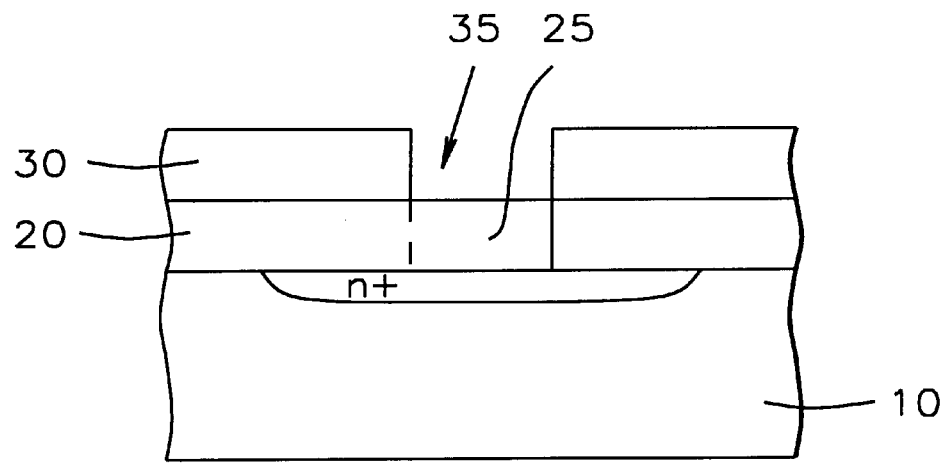
*FIG. 1a - Prior Art*
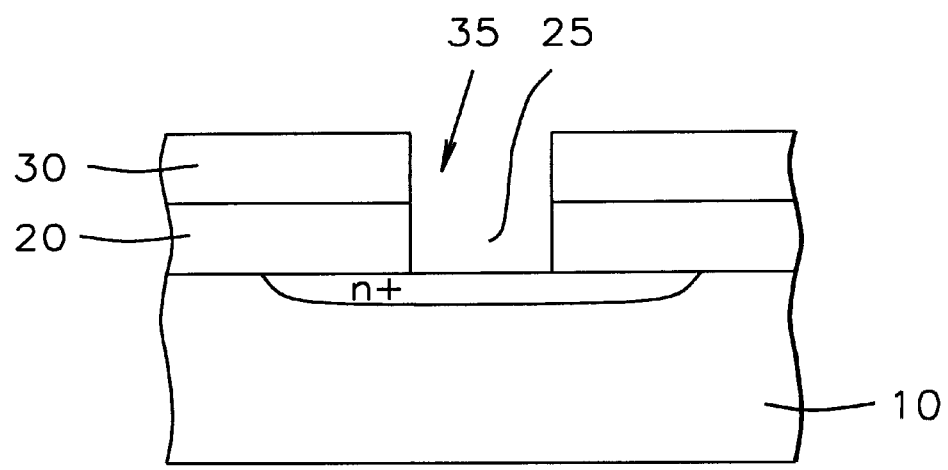
*FIG. 1b - Prior Art*

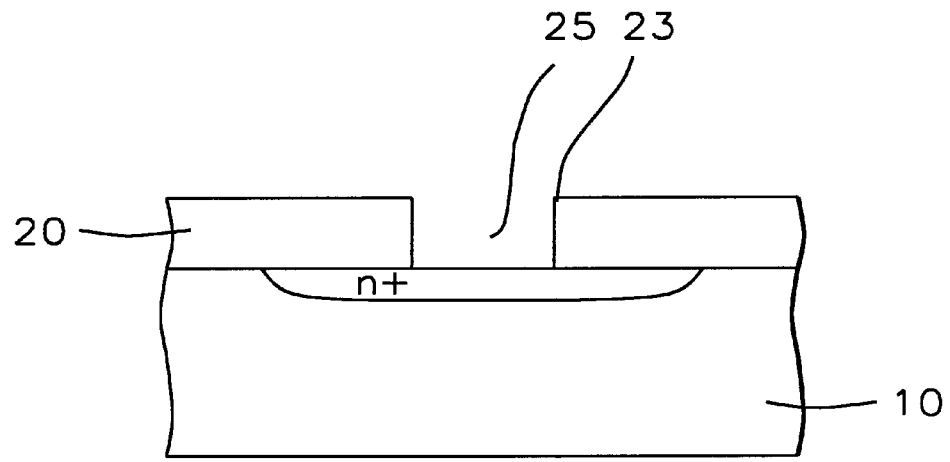
FIG. 1c – Prior Art
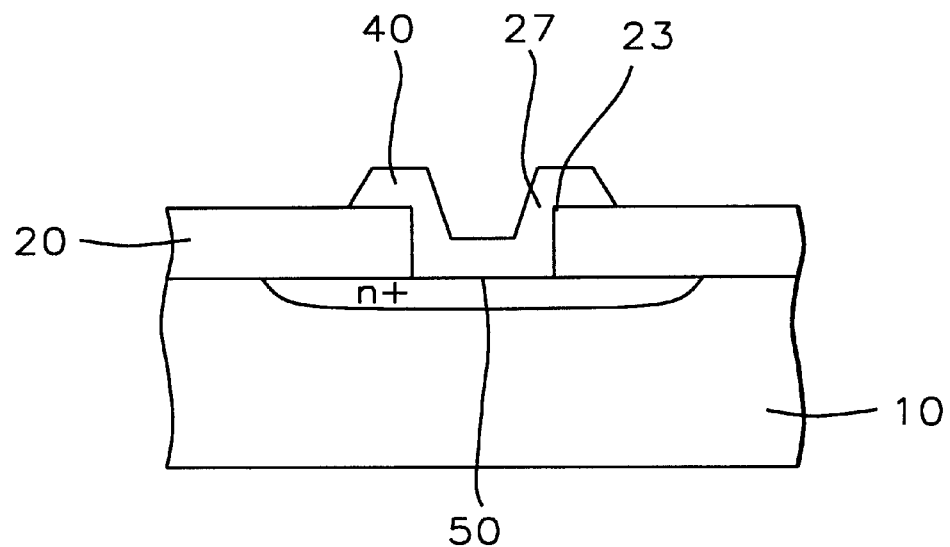
FIG. 1d – Prior Art

CONTACT PROCESS USING Y-CONTACT ETCHING

This is a division of patent application Ser. No. 08/835,575, filing date Apr. 9, 1997, now U.S. Pat. No. 5,950,104, New Contact Process Using Y-Contact Etching, assigned to the same assignee as the present invention.

BACKGROUND OF THE INVENTION (1) Field of the Invention

The present invention relates to manufacturing of semiconductor devices in general, and in particular, to manufacturing of contact holes in semiconductor devices using a novel, single type, two-step Y-etching process.

(2) Description of the Related Art

Controlled manufacture of the shape and dimensions of holes through which connections are made between various components of integrated circuits in semiconductor substrates is very important, as is well known in the art. Holes are usually formed by etching through a dielectric layer that separates one or more layers of components of an integrated circuit. If the holes filled with metal connect conductive layers, they are referred to as via holes, and as contact holes if they connect the devices that are formed on the substrate.

A typical hole is shown in FIG. 1a. Here, hole (25), shown in phantom and in solid lines in FIG. 1b, is formed by etching dielectric layer (20), deposited on substrate (10) by well-known methods, through an opening (35) formed in photoresist layer (30). Photoresist layer (30) is later removed as shown in FIG. 1c. The shape of the hole entrance edge (23) in FIG. 1c is important because it determines how well the metal that is deposited later into the hole covers the edge of the entrance, usually known as step coverage (27). If step coverage (27) is poor, that is if metal (40) over the edge (23) is thin and variable as is usually the case with vertical holes as shown in FIG. 1c, then the metal may crack there causing reliability problems.

At the same time, the width of the contact area (50) of hole (25) over a device such as source or drain of a MOS structure shown in FIG. 1d is also important because, as is well known, the electrical contact resistance is determined by the size of the contact area. The larger the area, the smaller is the contact resistance. Hence, especially with today's ultra large scale integrated (ULSI) technology where the device sizes have been shrinking dramatically, the importance of the available area on a substrate has become even more critical. Shrinking in the lateral dimensions has also caused the aspect ratio (height over width) of the holes to increase, which in turn has made the forming, cleaning and filling of the holes that much more difficult. The method of forming holes disclosed in this invention addresses these problems.

Prior art also addresses some of these problems, but not in all aspects of the disclosure presented here. In addition to the structural characteristics, the nature of the process step and the number of process steps that are needed to form holes in a semiconductor substrate is important from the point of view of throughput and cost. Hsu in U.S. Pat. No. 5,552,343 teaches a method for forming tapered edges in order to improve step coverage over the edge of the hole. Sikora in U.S. Pat. No. 5,420,078 also teaches a method for varying the edge of a hole for the same reasons. However, both Hsu and Sikora use a wet etch and a dry etch which require two different process steps and two different chambers. Yamagata, et al. in U.S. Pat. No. 5,441,595 teaches still another method for forming tapered opening, but using a one-step dry etch. On the other hand, the dry etch used by Kim in U.S. Pat. No. 5,490,901 is of another type dry etch, but different from the methods of this invention. The method taught by this invention provides a combined tapered and straight contact or via hole formed by a single, two-step dry etch process thereby achieving good step coverage and maximum contact area when the hole is filled with metal.

SUMMARY OF THE INVENTION

It is therefore an object of this invention to provide a new method for fabricating Y-shaped contact holes in dielectric layers in semiconductor substrates.

It is another object of this invention to reduce the number of steps in forming contact holes in semiconductor devices.

It is still another object of this invention to provide a method for maximizing the available contact area in contact holes of semiconductor devices.

These objects are accomplished by forming holes in semiconductor substrates through the use of a single, two-step dry etch process. First, the upper, tapered portion of the Y-hole is formed by isotropic dry etching of the dielectric layer. This is followed by again a dry etch, but at this second step, adjusted to perform anisotropic etching of the lower, straight portion of the Y-shaped hole. Using a single dry etch reduces the number of process steps, and the lower, straight portion of the Y-hole provides the maximum contact area achievable

BRIEF DESCRIPTION OF THE DRAWINGS

In the accompanying drawings, similar numerals refer to similar parts throughout the several views.

FIGS. 1a–1d are partial cross-sectional views of a semiconductor substrate showing the steps of forming conventional contact holes.

DESCRIPTION OF THE PREFERRED EMBODIMENTS

Figure 2A:
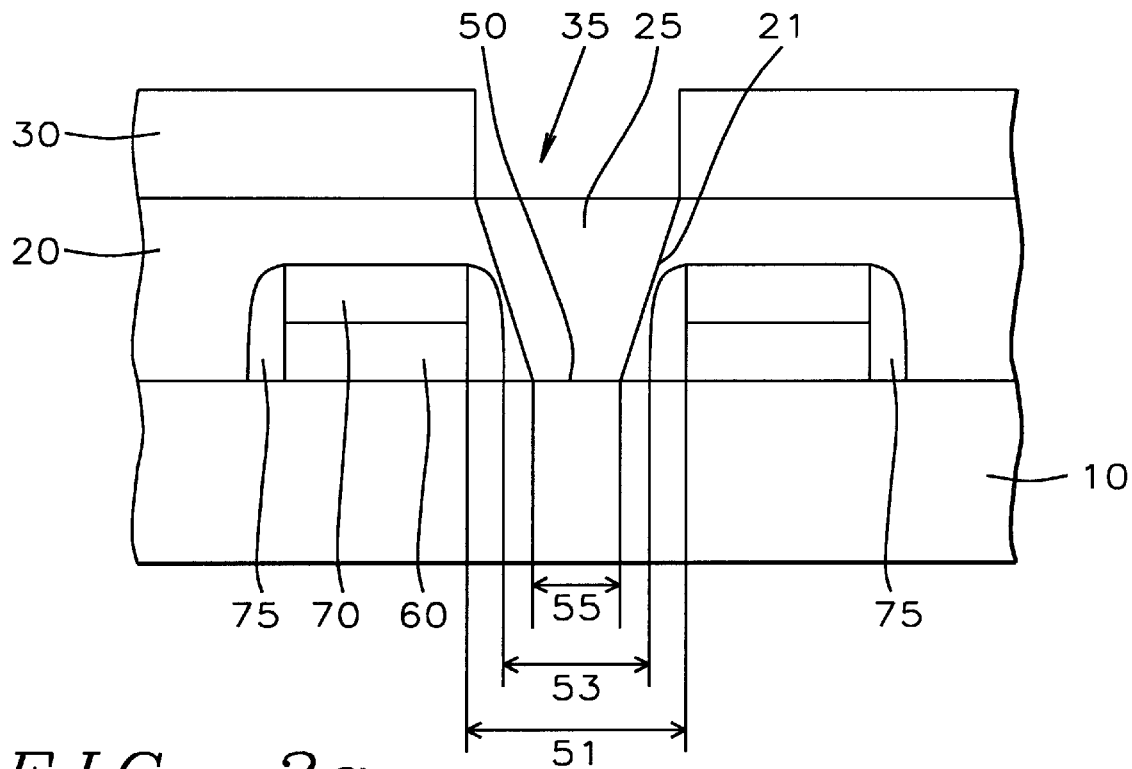
FIG. 2a is partial cross-sectional view of a semiconductor substrate showing the forming of a tapered hole by means of isotropic dry etch process of this invention.

Referring now to the drawings, in particular to FIGS. 2a–2d, there are shown schematically, steps for forming holes of different shapes over a device area on a semiconductor substrate. Substrate (10) shown in the Figures is provided with contact region (50) and polysilicon gate electrodes (60). In FIG. 2a, tapered hole (25) is formed to improve step coverage as described earlier. The forming of the hole is accomplished by means of etching dielectric layer (20) through openings (35) in photoresist layer (30) formed as a mask.

However, it will be appreciated that because of the angle of the taper, hole (25), upon reaching the contact area (50) assumes a width (55) which is less than the available width (53) of the contact area. Actually, the maximum width (51) that is available between polycide structures (60) of the MOS device shown in FIG. 2a is already narrowed by the presence of oxide spacers (75) that are formed to shape the polycide structures themselves. The oxide spacers, which also aid in the tapering of hole (25), thus reduce the maximum contact area width (51) to width (53).

Figure 2B:
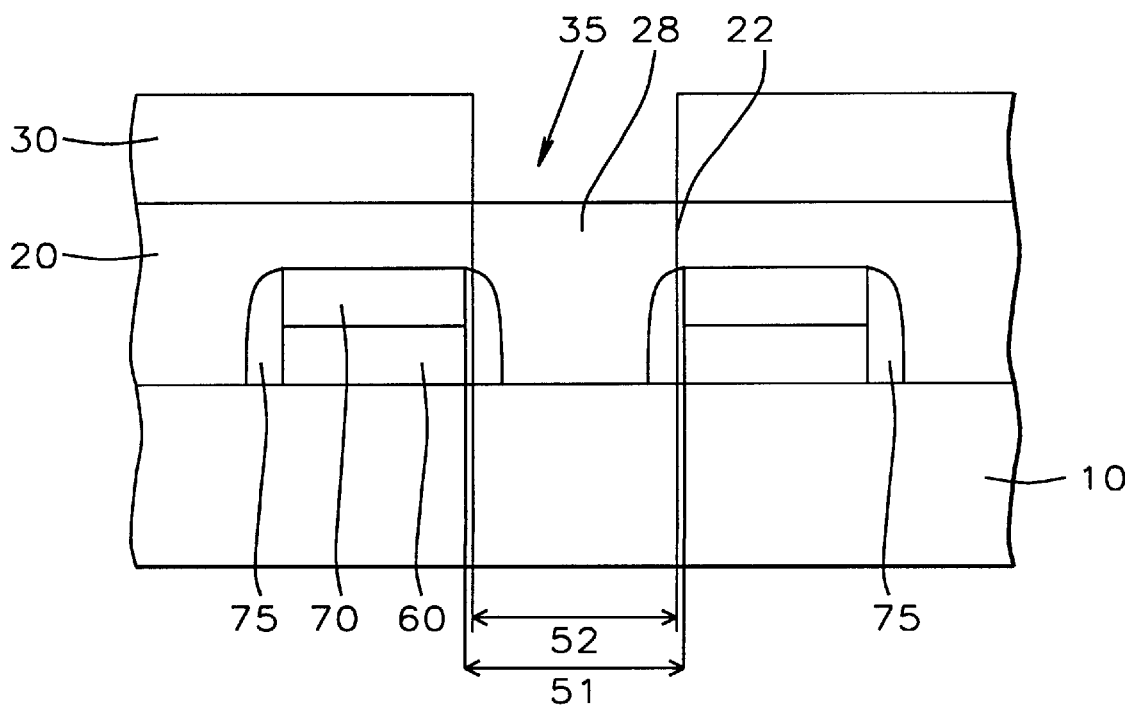
FIGS. 2b–2c are partial cross-sectional views of a semiconductor substrate showing the forming of a conventional straight hole by means of anisotropic dry etch process of this invention.
Figure 2C:
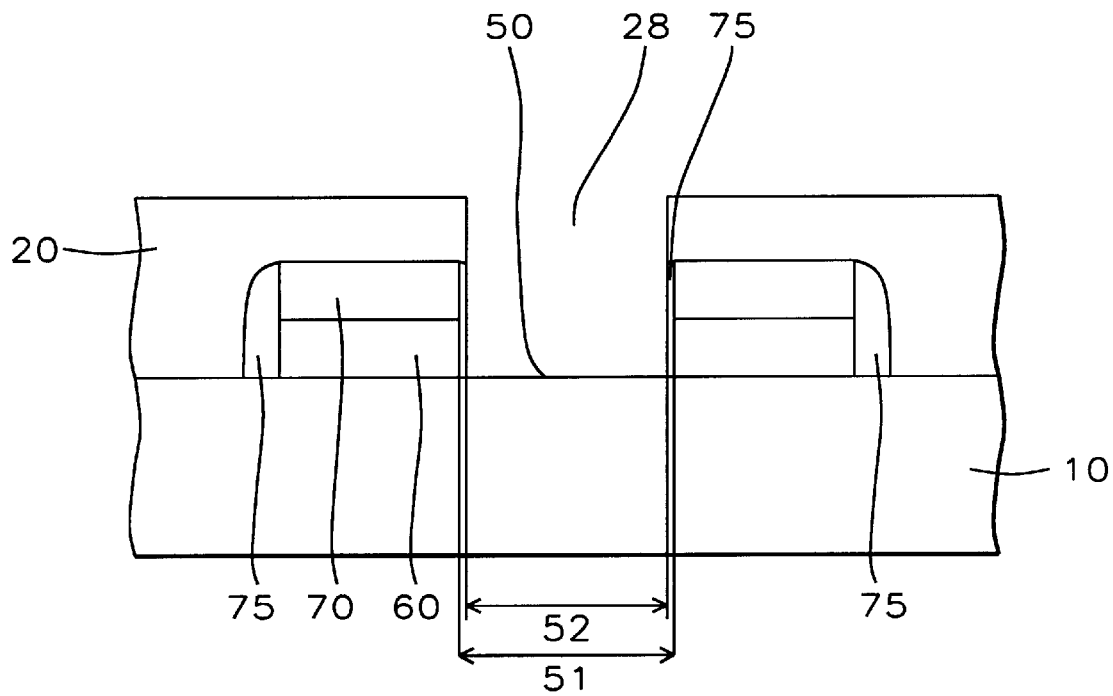
Figure 2D:
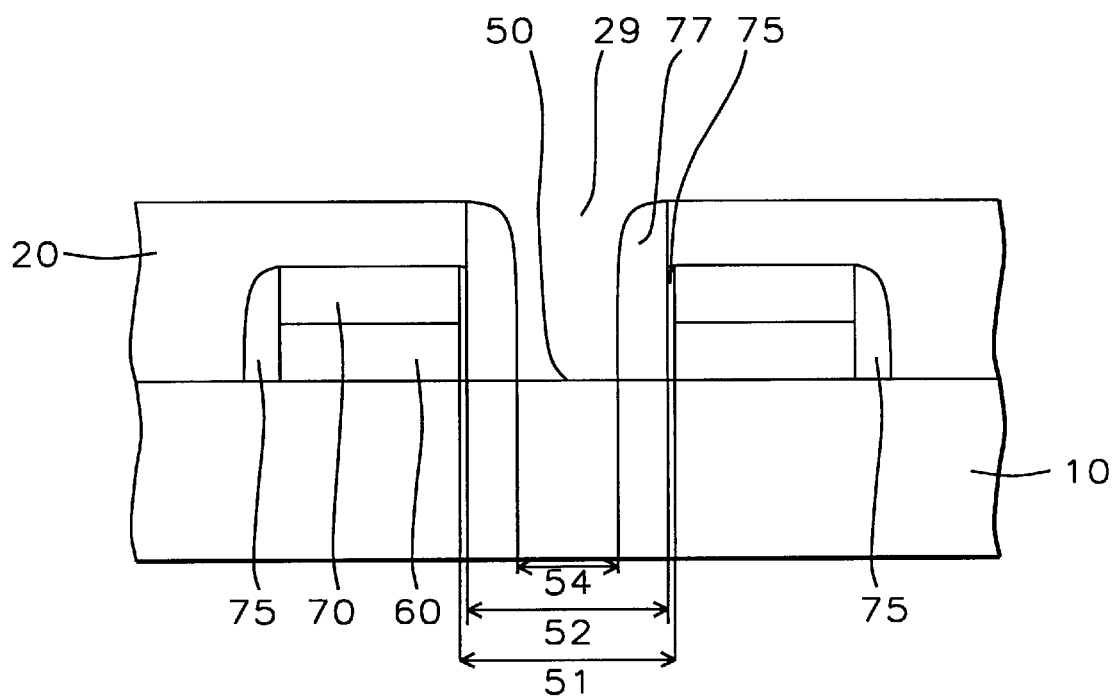
FIG. 2d shows the forming of oxide spacers in the straight hole of FIG. 2c.

In order to gain back some of the area lost to sidewall spacers (75), it is common to use dry etch first to form vertical walls (22) as shown in FIG. 2b yielding contact area width (52) which is larger than the earlier contact width (53). However, since this results in the etching away of some portions of the insulating spacer (75) as shown in FIG. 2c, another spacer (77) is formed by depositing a conformal oxide layer and then etching it back. The resulting contact width (54), though larger than the width (55) obtained earlier with tapered etching of FIG. 2a, can be improved still more with the method disclosed in this invention.

In this invention, a single two-step ion assisted dry etch is used to form both the tapered and the straight portions of a Y-shaped hole where the contact width provided by the end of the straight portion is larger than that is attainable by conventional methods. Furthermore, since the two-step process involves the same dry etch, the steps of alternating between a wet etch and dry etch are eliminated and both steps are performed in the same one chamber. In addition to economizing with the use of one chamber, possible contamination exposure is also reduced by not transferring the substrate from one etching chamber to another.

Figure 3A:
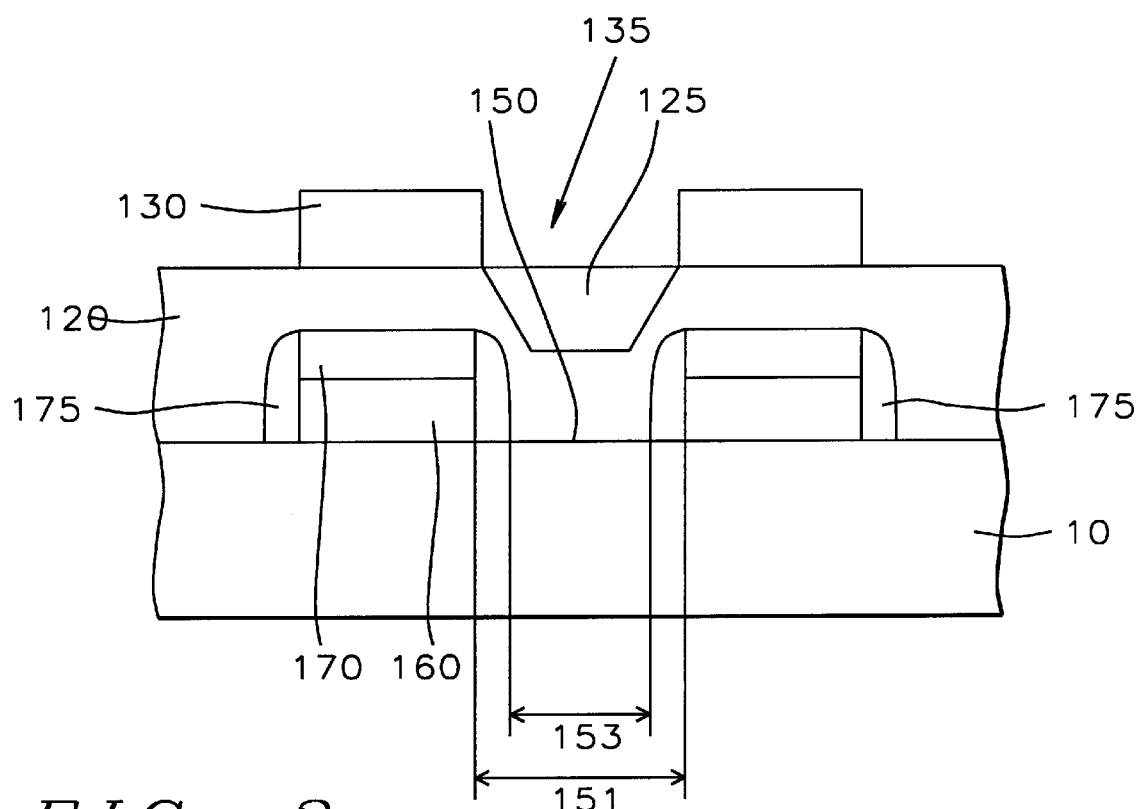
FIG. 3a is partial cross-sectional view of a semiconductor substrate showing the forming of the tapered portion of a Y-shaped hole of this invention by means of an isotropic dry etch process.
Figure 3B:
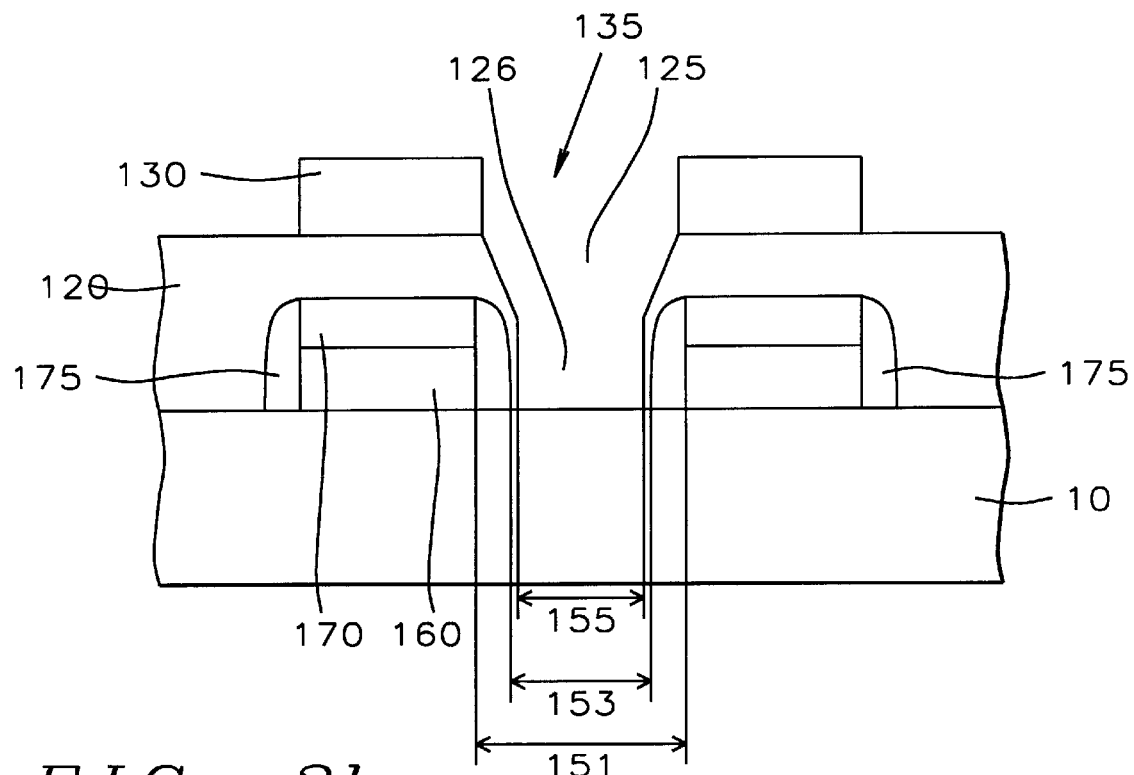
FIG. 3b is partial cross-sectional view of a semiconductor substrate showing the completion of a Y-shaped contact hole by means of an anisotropic dry etch process of this invention.

Thus, now referring to FIGS. 3a and 3b, there is shown a method of forming Y-shaped hole comprising an upper tapered portion (125) in the shape of the capital letter "V" and a lower straight portion (126) in the shape of the capital letter "I". Although not necessary, it is preferred that gate electrodes (160) are formed of polycide comprising polysilicon (poly-Si) and tungsten. It will be noted in FIGS. 3a and 3b that distance (151) between electrodes (160) establishes the maximum width of the contact area that is available. Polycide gates (160) are further covered on top (170) and on the sides (175) with preferably silicon nitride (SiN) deposited by LPCVD (low pressure chemical vapor deposition) to a thickness between about 1000 to 2000 angstroms (A) at a pressure between about 0.1 to 1.0 torr and temperature 700 to 900° C. Silicon nitride is commonly used as a diffusion barrier. Here, its use is also preferred on the sidewalls of gates (160) to serve as spacers (175). Spacers are formed by depositing SiN conformally and then etching it back anisotropically. It is preferred that the etching is performed with a recipe of LPCVD at a pressure between about 0.1 to 0.2 torr and temperature between about 700 to 900° C. Because of the directional etching properties of anisotropic etching, unetched portions of SiN at the vertical sides of polycide electrodes remain and form spacer structures (175) as shown in FIGS. 3a and 3b. The spacers then reduce the maximum contact area width to distance (153) in the same Figures.

Next, a composite dielectric layer (120) is formed over the polycide structures by depositing a layer of tetraethyl orthosilicate (TEOS) to a thickness between about 1000 to 5000 angstroms (Å) at a pressure between about 0.1 to 1.0 torr followed by a second layer, preferably spin-on-glass (SOG), of thickness between about 2000 to 7000 Å and cured at between about 700 to 900° C. for between about 20 to 60 minutes. Composite layer (120) is then planarized.

Subsequently, a layer of photoresist (130) is applied to planarized layer (120) with a preferred thickness between about 7000 to 15000 Å. Holes (135) at the locations where contact areas (150) will be formed are patterned in the photoresist as shown in FIG. 3a. Holes are then etched through the patterned mask partially into dielectric layer (120) to form the upper portion of Y-shape hole as shown in FIG. 3a. With the presence of underlying spacers (175) and the particular etch recipe used, it is found that etching of the spacers can be avoided. As a key step in the preferred embodiment of this invention, the first etch used here is omnidirectional and isotropic ion assisted dry-etch employing fluorine containing gas $CHF_3$ at a pressure between about 20 to 60 mtorr and at a flow rate between about 200 to 400 standard cubic centimeter per minute (sccm). In other embodiments, fluorinated gases mixed with oxygen or carbon oxide such as $C_4F_8/O_2$ and $CHF_3/CO$ are also used.

A main feature and key spirit of the present invention is the in situ conversion of the first isotropic dry-etching to second anisotropic dry-etching while at the same time varying the tapered etch to a straight etch for the remaining lower portion (126) of the Y-shaped hole. The bottom of hole (126) now forms a maximized contact area (155) as shown in FIG. 3b. It will be appreciated that in this single but two-step dry etch process, neither an additional etching step nor additional mask is required since upper portion (125) of Y-hole serves as in situ mask for forming lower portion (126) of the same hole. The preferred recipe for the second anisotropic dry-etch comprises $CHF_3$ at a flow rate between about 20 to 90 standard cubic centimeter (sccm) and ion assisted with argon $Ar^+$ at a rate between about 250 to 500 sccm and CO at 150–300 sccm.

In the descriptions of the embodiments given above, numerous details were set forth, such as specific materials, process parameter, etc., in order to provide a thorough understanding of the present invention. It will be obvious, however, to those skilled in the art that these specific details need not be employed to practice the present invention. Furthermore, the disclosed method for forming Y-shaped holes is applicable not only to contact holes, but also to via holes formed in an interlevel dielectric layer separating any two intermetal layers in a semiconductor substrate.

That is to say, while the invention has been particularly shown and described with reference to the preferred embodiments thereof, it will be understood by those skilled in the art that various changes in form and details may be made without departing from the spirit and scope of the invention.

What is claimed is:

1. A Y-shaped hole structure comprising:

providing a semiconductor substrate;

an interlevel dielectric layer formed on said substrate;

a V-shaped upper portion of said Y-shaped structure etched into said interlevel dielectric layer;

an I-shaped lower portion of said Y-shaped structure etched into said interlevel dielectric layer extending from said V-shaped upper portion of said Y-shaped hole structure.

2. The structure of claim 1, wherein said dielectric layer is planarized spin-on-glass.

3. The structure of claim 1, wherein said V-shaped upper portion of said Y-shaped structure is etched into said interlevel dielectric layer with isotropic recipe comprising $C_4F_8$ at a flow rate between about 20 to 30 sccm and $O_2$ at a rate between about 3 to 12 sccm.

4. The structure of claim 1, wherein said I-shaped lower portion of said Y-shaped structure is etched into said interlevel dielectric layer with anisotropic recipe comprising $CHF_3$ at a flow rate between about 150 to 300 sccm and CO at a rate between about 150 to 300 sccm, and Ar at a rate between about 250 to 500 sccm.

* * * * *